US010032522B2

United States Patent
Luan et al.

(10) Patent No.: US 10,032,522 B2
(45) Date of Patent: Jul. 24, 2018

(54) THREE-TRANSISTOR OTP MEMORY CELL

(71) Applicant: Synopsys, Inc., Mountain View, CA (US)

(72) Inventors: Harry Luan, Saratoga, CA (US); Tao Su, Sunnyvale, CA (US); Larry Wang, San Jose, CA (US); Charlie Cheng, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/620,657

(22) Filed: Jun. 12, 2017

(65) Prior Publication Data

US 2017/0358368 A1    Dec. 14, 2017

Related U.S. Application Data

(60) Provisional application No. 62/348,732, filed on Jun. 10, 2016.

(51) Int. Cl.
| | |
|---|---|
| G11C 17/00 | (2006.01) |
| G11C 17/18 | (2006.01) |
| G11C 17/16 | (2006.01) |
| H01L 23/535 | (2006.01) |
| H01L 27/112 | (2006.01) |
| G11C 17/14 | (2006.01) |

(52) U.S. Cl.
CPC .............. *G11C 17/18* (2013.01); *G11C 17/14* (2013.01); *G11C 17/16* (2013.01); *H01L 23/535* (2013.01); *H01L 27/11206* (2013.01)

(58) Field of Classification Search
CPC .................................................. H01L 27/11206
USPC ............................................................ 365/96
See application file for complete search history.

(56) References Cited

U.S. PATENT DOCUMENTS

| | | | | |
|---|---|---|---|---|
| 9,852,805 | B2 * | 12/2017 | Luan | G11C 17/18 |
| 2003/0071296 | A1 | 4/2003 | Peng | |
| 2003/0198085 | A1 * | 10/2003 | Peng | G11C 11/5692 |
| | | | | 365/185.12 |
| 2006/0221698 | A1 | 10/2006 | Obuchi | |
| 2007/0030719 | A1 * | 2/2007 | Hoefler | G11C 17/16 |
| | | | | 365/94 |
| 2012/0008364 | A1 | 1/2012 | Lai et al. | |

FOREIGN PATENT DOCUMENTS

KR    101095730 B1    12/2011

OTHER PUBLICATIONS

European Extended Search Report, European Application No. 17175419.5, dated Oct. 17, 2017, 7 pages.

* cited by examiner

*Primary Examiner* — Hoai V Ho
(74) *Attorney, Agent, or Firm* — Fenwick & West LLP

(57) ABSTRACT

An OTP (One-Time Programmable) memory cell in an array has a programming MOSFET and symmetrically placed access transistors on either side of the programming MOSFET. The balanced layout of the memory cell improves photolithographic effects with a resulting improved process results. Results of programming the memory cell is also improved.

12 Claims, 3 Drawing Sheets

US 10,032,522 B2

THREE-TRANSISTOR OTP MEMORY CELL

CROSS-REFERENCE TO RELATED APPLICATIONS

This patent application claims the benefit of U.S. Provisional Patent Application No. 62/348,732, filed Jun. 10, 2016, which is incorporated by reference along with all other references cited in this application.

BACKGROUND OF THE INVENTION

This invention relates to an improved OTP (One-Time Programmable) memory cell and, in particular, a three-transistor OTP memory cell with improved programmability.

NVM (Nonvolatile memory) integrated circuits retain stored data even after power is removed. Such devices are found in many consumer electronics and industrial applications. A common memory cell in NVM integrated circuits is the antifuse memory cell based upon the programming of a gate dielectric layer. Such antifuse memory cells, more particularly, the one-time programmable (OTP) memory cell, are commonly used by integrated circuit designers since such cells are compatible with standard logic CMOS (Complementary Metal-Oxide-Semiconductor) process flows.

An OTP memory cell includes a dielectric layer, such as the gate oxide, in a capacitor structure. The memory cell may include one or more select devices, such as a MOSFET (Metal-Oxide-Semiconductor-Field-Effect-Transistors), or a diode, such as a gated diode, to enable selective programming, the rupturing of the dielectric layer for an electrical connection, and reading of the memory cell. Each memory cell stores a bit of information, a "1" or a "0," depending on whether the cell has been programmed or not. A correspondence between a value of a bit and whether a cell is programmed may be defined arbitrarily. An array of such OTP memory cell includes the location of memory cells at cross points of orthogonal bit lines and word lines.

Even though OTP memory cell arrays have been in use for many years, a persistent problem is the variability in the quality of the programmed connection in a memory cell. A significant portion of this variability can be attributed to layout-dependent effects on the program capacitor and the select device. That is, physical variations in the OTP memory cells adversely affect the post-programmed resistance and therefore the reading of the OTP memory cell state. A more robust antifuse OTP design is desired to improve the physical uniformity of the array memory cells and the distribution of the programmed cell read current.

BRIEF SUMMARY OF THE INVENTION

The present invention provides for an integrated circuit OTP (One-Time Programmable) memory cell comprising a programming MOSFET having source/drain regions; and two pass transistors symmetrically located with respect to the programming MOSFET and each pass transistor connected to one of the source/drain regions of the programming MOSFET; whereby programmability of the memory cell is enhanced. The two pass transistors comprise a first pass MOSFET and a second pass MOSFET. The first pass MOSFET has a gate electrode, and first and second source/drain regions in a substrate for the integrated circuit, the first source/drain region connected to a first conducting line, and the gate electrode controlling electrical connection between the first and second source/drain regions. The first pass MOSFET gate electrode is part of a second conducting line. The second pass MOSFET has a gate electrode, and third and fourth source/drain regions in the substrate for the integrated circuit, the fourth source/drain region connected to the first conducting line, and the gate electrode controlling electrical connection between the third and fourth source/drain regions. The second pass MOSFET gate electrode is connected to the second conducting line. The programming MOSFET comprises a gate electrode between the second and third source/drain region. Programmability of the OTP memory cell is enhanced.

The present invention also provides for a method of programming an integrated circuit OTP memory cell. The memory cell has a programming MOSFET having two source/drain regions and a gate electrode over a channel region between the two source/drain regions. The method has the steps of accessing the two source/drain regions; driving the two source/drain regions to a first voltage; and driving the gate electrode to a second voltage to create a high voltage differential between the gate electrode and the two source/drain regions. Programming of the OTP memory cell is improved.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
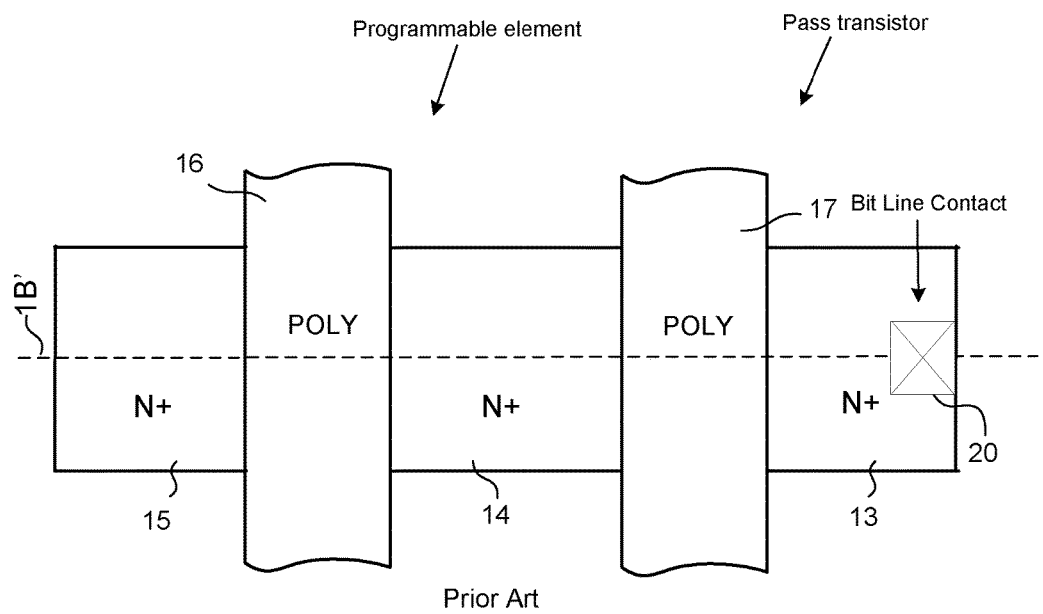
FIG. 1A shows a top view of a current two-transistor OTP memory cell.

FIG. 1A is a top layout view of a current two-transistor OTP memory cell, which has a pass transistor and a programmable element, a second transistor. The two transistors are MOSFETs, each with a gate electrode over a channel region separating two source/drain regions. In the FIG. 1A memory cell the pass or select transistor is formed by a gate electrode 17 over a channel region which separates two N+ source/drain regions 13 and 14 located in a semiconductor body 12 of P-conductivity. A thin insulating oxide layer 19 (see FIG. 1B), called a gate oxide and not shown in this top view, separates the body 12 and N+ regions 13 and 14 from the gate electrode 17. The two source/drain regions 13 and 14 and the gate electrode 17 define a channel region on the top of the body 12 for the pass transistor. The N+ source/drain region 13 is connected to a bit line above (not shown) by a conducting plug 20.

Besides the pass transistor, the N+ source/drain region 14 also forms a source/drain region for the second MOSFET transistor, the programmable element. A second N+ source/drain region 15 is part of the second MOSFET transistor which has a gate electrode 16 over a channel region which separates the two N+ source/drain region 14 and 15. A thin insulating gate oxide layer 18 separates the body 12 and N+ regions 14 and 15 from the gate electrode 16. The two source/drain regions 14 and 15 and the gate electrode 16 define a channel region on the top of the body 12 for the programmable element. The gate electrodes 16 and 17 can be formed by many different conductive materials including, e.g., doped polysilicon, metals (such as tungsten and tantalum), silicides (alloys of metal and polysilicon), and other materials and combinations of materials, which are well known in the semiconductor processing field. In the drawing, the electrodes 16, 17 are labeled "Poly" to further indicate that the electrodes are gate electrodes for the transistors and run vertically in the drawing. The bit line mentioned in the previous paragraph runs horizontally in the drawing so that an array of such memory cells forms an array of bit lines running in one direction and word lines (the gate electrodes) running in a direction perpendicular to the bit lines.

Figure 1B:
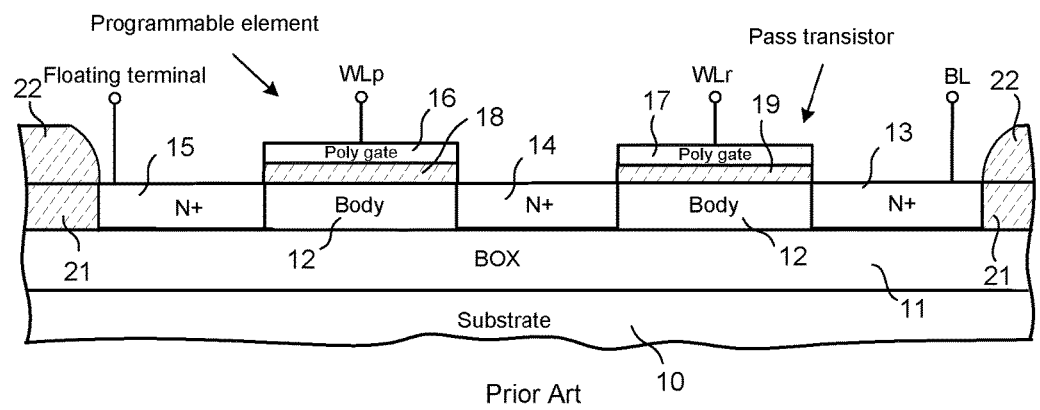
FIGS. 1B and 1C are representational cross-sectional side views of the FIG. 1A memory cell manufactured with different semiconductor processes, Silicon-On-Insulator (SOI) and bulk with deep N-Well, respectively.
Figure 1C:
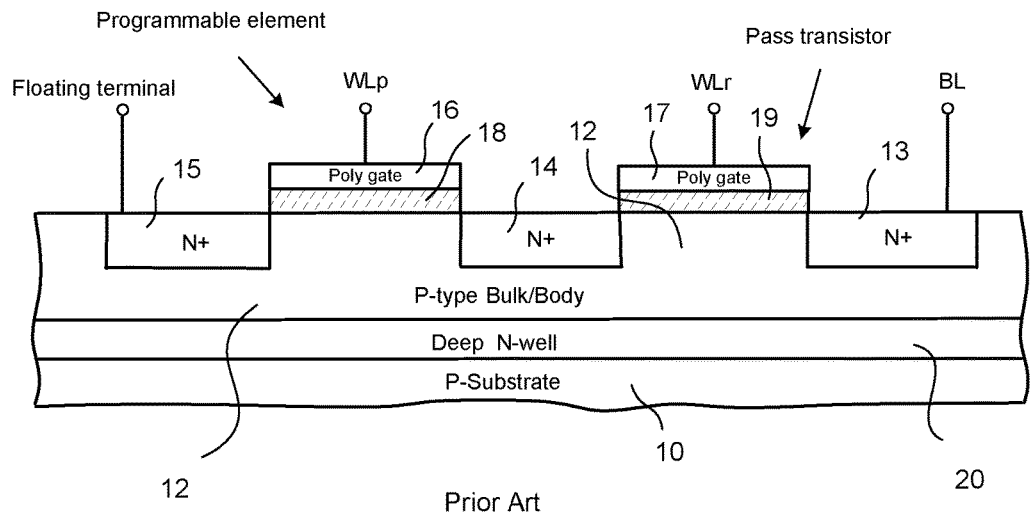

Various semiconductor processes can be used to manufacture the memory cell shown by the top view of FIG. 1A. One exemplary MOSFET process technology shown in FIG. 1B is a SOI (Silicon-On-Insulator) process. Here the P-type body 12 rests on an insulating BOX (Body OXide) layer 11 which in turn rests on a semiconductor substrate 10. Another MOSFET process technology, shown in FIG. 1C, provides for the N+ source/drain regions 13-15 of the MOSFET transistors to be formed in the P-type body, a P-well, which is located in a deep N-type well on a P-type substrate. The same reference numerals in FIG. 1A are used for similar regions in FIGS. 1B and 1C. Reverse-biased PN junctions provide electrical isolation for the bulk/body regions 12 in FIG. 1C in contrast to the isolation provided to the body regions 12 by the BOX layer 11 of FIG. 1B. Reference is made to U.S. Pat. Nos. 7,471,540 and 7,623,368, both of which are assigned to the present assignee and incorporated by reference herein for all purposes, for further details of the different structures of the OTP memory cells which should not considered limitations of the present invention. The OTP memory cells can be formed by other semiconductor processes.

To program a memory cell, a voltage on the word line WLr turns on the pass transistor. A voltage on the bit line BL is driven low, ground or even negative, while a voltage on the programming element gate electrode, the word line WLp, is pulled high. The voltage for the programming element source/drain region opposite the pass transistor can be left floating. Some representative programming voltages are 0V for the bit line, +3.0V for the word line WLr, and +6.5V for the word line WLp. The goal of these voltages to create a high voltage differential between the programming gate electrode 16 and the source/drain region 14 (or the body 12 of the channel region of the programming element) so that the thin gate oxide 18 ruptures to create a conducting path between the gate electrode and the source/drain region 14. An unprogrammed memory cell has no conducting path. A bit of information is stored in the OTP memory cell as either a programmed or unprogrammed cell, i.e., whether there is a connection between the WLp and the source/drain region 14 or not.

A recurring problem for OTP cells is the quality of the programmed connection, or more precisely, the variation in the quality of the programmed connection. Gate oxide breakdown can vary widely with unwelcome decreased conductivity and large variations in the conductivity of the memory cells of an array. That is, the programmed connection can be electrically weak so that it is difficult to determine or read the state of the bit, i.e., 1 or 0, stored in the cell. Or even if when the bit can be read, the time interval to read the state of the bit is undesirably long. This variation of the programmed connection quality is attributed to microscopic anomalies or irregularities in the manufactured cell. Hence there have been many different approaches, such as described in the patents cited above, for improvements to lessen the variations in the gate oxide breakdown. Nonetheless, despite the improved programming results, continued improvements in the programmed connections are highly desirable.

Figure 2A:
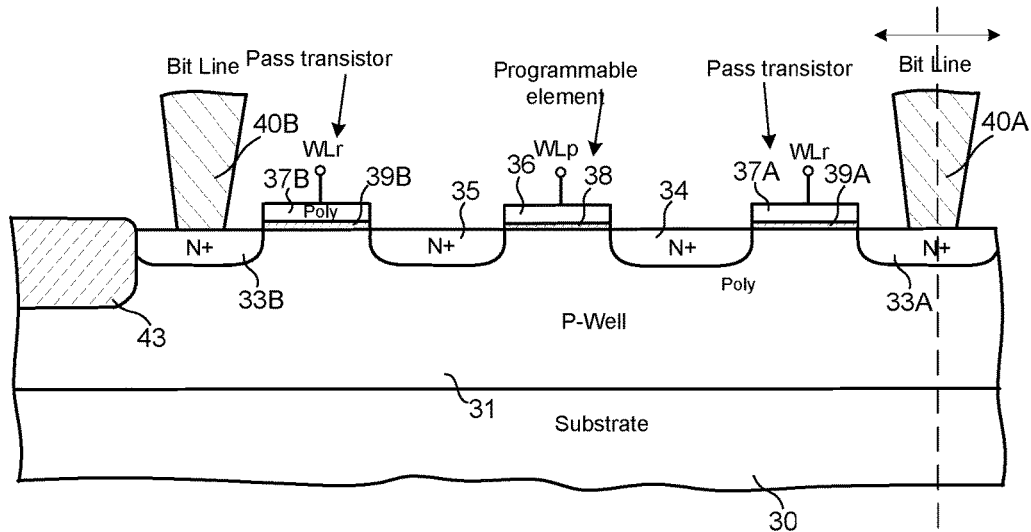
FIG. 2A is a cross-sectional side of a three-transistor OTP memory cell according to one embodiment of the present invention.

The present invention provides for a three-transistor OTP memory cell for further advancements for the OTP memory cell. FIG. 2A is a cross-sectional view of a three-transistor OTP memory cell, according to one embodiment of the present invention. It should be noted that FIG. 2A is drawn in a less stylized manner than that of FIGS. 1B and 1C. The three-transistor OTP memory cell has two pass transistors and a programmable element, a third transistor, between the two pass transistors. As in the case of the two-transistor OTP memory cell, the transistors are MOSFETs, each with a gate electrode over a channel region separating two source/drain regions.

The pass transistor on the right of the drawing is formed by a gate electrode 37A over a channel region separating two N+ source/drain regions 33A and 34 located in a semiconductor body 31 of P-conductivity on a substrate 30. A thin insulating oxide layer 39A, the gate oxide separates the body 12 and N+ regions 33A and 34 from the gate electrode 37A. The two source/drain regions 33A and 34 and the gate electrode 37A define a channel region on the top of the body 12 for the pass transistor. The N+ source/drain region 33A is connected to a bit line above (not shown) by a conducting plug 40A and the gate electrode 37A is part of a word line WLr for accessing the OTP memory cell.

Besides the pass transistor, the N+ source/drain region 34 also forms a source/drain region for the middle MOSFET transistor, the programmable element. A second N+ source/drain region 35 is part of the middle MOSFET transistor which has a gate electrode 36 over a channel region separating the two N+ source/drain regions 34 and 35. A thin insulating gate oxide layer 38 separates the body 12 and N+ regions 34 and 35 from the gate electrode 36. The two source/drain regions 34 and 35 and the gate electrode 36 define a channel region on the top of the body 12 for the programmable element. The gate electrode 36 is part of a word line WLp for programming the OTP memory cell.

The pass transistor on the left of the drawing is formed by a gate electrode 37B over a channel region separating two N+ source/drain regions 33B and 35. A thin insulating oxide layer 39B, the gate oxide separates the body 12 and N+ regions 33B and 35 from the gate electrode 37B, and the two source/drain regions 33B, 35 and the gate electrode 37B define a channel region on the top of the body 12 for the left pass transistor. The gate electrode 37B is part of the word line WLr for accessing the OTP memory cell. Also, the N+ source/drain region 33B is connected to the bit line above (not shown) by a conducting plug 40B, i.e., both source/drain regions 33A and 33B are connected to the same bit line which runs horizontally in the drawing. The word lines WLp and WLr run perpendicular to the bit lines of the array. In FIG. 2A the word lines run perpendicularly to the surface of the drawing. It should be understood that different semiconductor processes may be used for the three-transistor OTP memory cell.

Figure 2B:
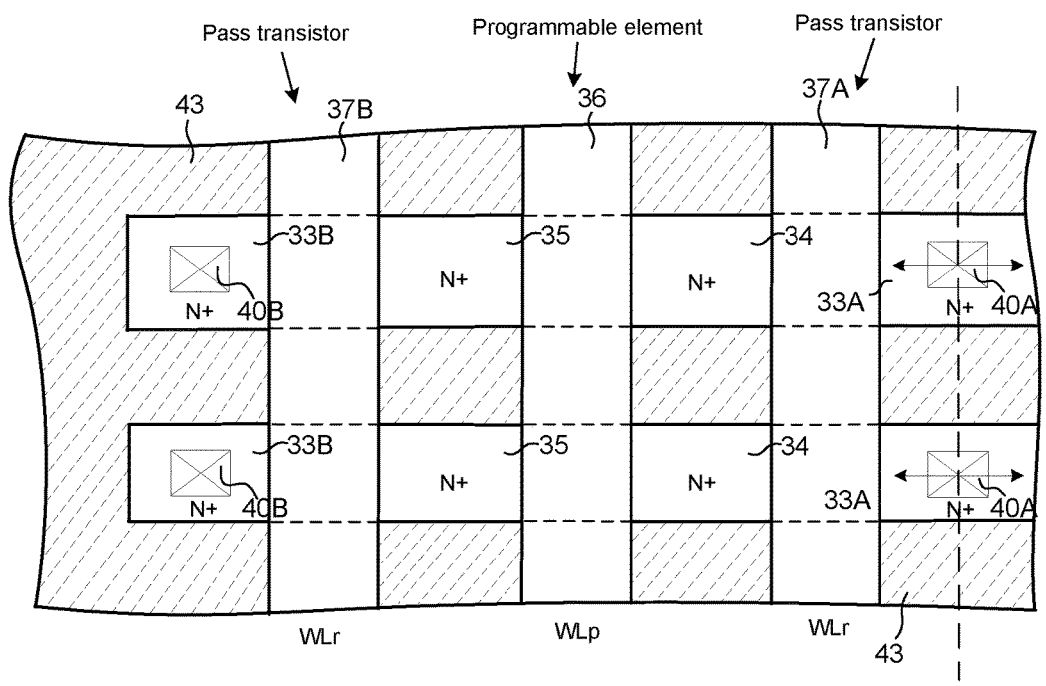
FIG. 2B is a topside view of the FIG. 2A memory cell.

FIG. 2B shows a 2-cell layout of the three-transistor OTP memory cell of FIG. 2A and illustrates how the bit lines of a memory cell array run in one direction (horizontally in the drawing) and the word lines (the gate electrodes) run in a direction perpendicular to the bit lines (vertically in the drawing). The two memory cells of FIG. 2B are located one above the other in the drawing and gate electrodes 37A, 37B and 36 run vertically in the drawing. The gate electrode 37A separates the N+ source/drain regions 33A and 34; the gate electrode 36 separates the N+ source/drain regions 34 and 35; and the gate electrode 37B separates the N+ source/drain regions 35 and 33B. The shaded portions 43 represent STI (Shallow Trench Isolation) which electrically isolates the memory cells in the array. In this particular layout of a three-transistor OTP memory cell array, each memory cell is mirrored so that a second cell is also connected to a common bit line conducting plug. In FIGS. 2A and 2B each conducting plug 40A is shared by a cell on each side of the vertical dashed line through the plugs, i.e., each of the memory cells shown in the drawing has a second memory cell (not shown) mirrored across the dashed vertical line.

Figure 2C:
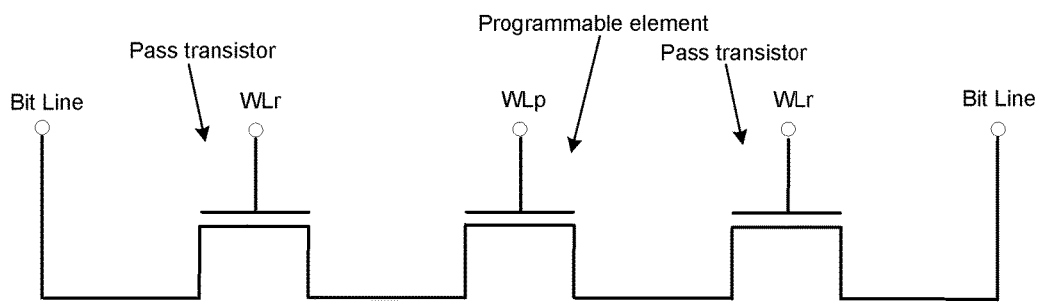
FIG. 2C is a circuit diagram of the FIG. 2A memory cell.

FIG. 2C is a representative electrical circuit diagram of a three-transistor OTP memory cell. Access to the programmable element, the middle programming transistor, is provided by access transistors on either side of the programmable element. Both pass transistors have source/drain regions which are commonly connected to the same bit line and gate electrodes which are commonly connected to the same word line.

To program the three-transistor OTP memory cell, the bit line (BL) is set low, at ground or negative voltage, and the WLr voltage on the gate electrodes is raised to turn on the pass transistor and the WLp voltage on the gate electrode of the programmable element is driven high. Both source/drain regions 34 and 35 are pulled to the BL voltage level through the two pass transistors. As a result, breakdown of the programming transistor gate oxide is more uniform across the entire channel. Moreover, the pass transistor drive current is doubled at a given WLr voltage when compared to the two-transistor cell and hard breakdown is more probable. A second advantage of the three-transistor cell is that a lower WLr voltage can be used during programming in order to pass the same program current. This can be significant if WLr voltage requires a voltage up-converter circuit.

From a comparison of the layouts of FIG. 1A and FIG. 2B, it is apparent that the three-transistor cells in a array will be much more uniform in terms of gate oxide thickness and quality, channel length and width, and other physical parameters of the program element, the central transistor. Because the isolated extension region 15 of the two-transistor OTP memory cell (see FIG. 1A) has a significant position dependence in an array and also variability across wafers, the width of the programmable element, the programming transistor, varies due to optical proximity effects and so does the gate oxide quality due to stress effects. In addition, the neighboring gate pitch change contributes to variations in gate dimension. In contrast, the three-transistor OTP memory cell is absent of all these limitations and hence has better cell physical and electrical uniformity. Hence the symmetric location of the two pass transistors with respect to the programming transistor improves the layout of the memory cells and a resulting uniformity in the manufactured cells of the array. Furthermore, the two pass transistors improve the programming results.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. As an example, the body region under the programming gate can be of the same conductivity type as that of source/drain regions 34 and 35. In another words, the programmable element MOSFET can be either an enhancement or depletion transistor. The scope of the invention is defined by the following claims.

The invention claimed is:

1. An integrated circuit OTP (One-Time Programmable) memory cell comprising:
   a programming MOSFET (metal-oxide-semiconductor field-effect transistor) having source/drain regions; and
   two pass transistors symmetrically located with respect to the programming MOSFET and each pass transistor connected to one of the source/drain regions of the programming MOSFET;
   wherein the two pass transistors comprise a first pass MOSFET having a first gate electrode connected to a word line and a second pass MOSFET having a second gate electrode connected to the same word line.

2. The OTP memory cell of claim 1, wherein:
   the first pass MOSFET having first and second source/drain regions in a substrate for the integrated circuit, the first source/drain region connected to a bit line, and the first gate electrode controlling electrical connection between the first and second source/drain regions;
   the second pass MOSFET having third and fourth source/drain regions in the substrate for the integrated circuit, the fourth source/drain region connected to the bit line, and the second gate electrode controlling electrical connection between the third and fourth source/drain regions; and
   the programming MOSFET comprises a gate electrode between the second and third source/drain regions connected to another word line.

3. The OTP memory cell of claim 2, wherein the bit line and the word line are used for accessing the memory cell, and the other word line is used for programming the memory cell.

4. The OTP memory cell of claim 1, wherein the first and second source/drain regions comprise N+ semiconductor regions.

5. The OTP memory cell of claim 2, wherein the word line and the other word line comprise material selected from the group comprising doped polysilicon, tungsten and tantalum, and silicides of metal and polysilicon.

6. A method of programming an integrated circuit OTP (One-Time Programmable) memory cell, the memory cell having a programming MOSFET (metal-oxide-semiconductor field-effect transistor) having two source/drain regions and a gate electrode over a channel region between the two source/drain regions and two pass transistors symmetrically located with respect to the programming MOSFET and each pass transistor connected to one of the source/drain regions of the programming MOSFET, the method comprising:
   accessing the two source/drain regions;
   driving the two source/drain regions to a first voltage; and
   driving the gate electrode to a second voltage to create a voltage differential between the gate electrode and the two source/drain regions above a threshold voltage;
   wherein the two pass transistors comprise a first pass MOSFET having a first gate electrode connected to a word line and a second pass MOSFET having a second gate electrode connected to the same word line, and the method further comprising driving the first gate electrode and the second gate electrode to a third voltage to turn on the two pass transistors and drive the two source/drain regions to the first voltage.

7. The programming method of claim 6, wherein accessing the two source/drain regions comprises turning on the two pass transistors, each pass transistor connected to one of the two source/drain regions and a bit line.

8. The programming method of claim 7, wherein driving the two source/drain regions comprises:

driving the bit line to the first voltage.

9. The programming method of claim 6, wherein the first gate electrode is over a channel region separating a first and second source/drain regions, the first source/drain region connected to a bit line, the second source/drain region comprising one of the two source/drains of the programming MOSFET, the second gate electrode is over another channel region separating a third and fourth source/drain regions, the fourth source/drain region connected to the bit line, the third source/drain region comprising other one of the two source/drains of the programming MOSFET, the method comprising:

placing the third voltage on the first gate electrode and the second gate electrode to turn on the first pass MOSFET and the second pass MOSFET to connect each of the two source/drain regions of the programming MOSFET to the bit line; and driving the bit line to the first voltage.

10. The programming method of claim 9, wherein the OTP memory cell is part of a memory cell array having a plurality of bit lines, a plurality of first word lines and a plurality of second word lines, and wherein one of the plurality of bit lines comprises the bit line, one of the plurality of first word lines comprises the word line of the first pass MOSFET and the second pass MOSFET, and one of the plurality of second word lines is connected to the gate electrode of the programming MOSFET, the method comprising:

placing a voltage on each of the first word lines for each of the first pass MOSFET and the second pass MOSFET to turn on the first pass MOSFET and the second pass MOSFET to connect each of the two source/drain regions of the programming MOSFET to the one of the plurality of bit lines;

driving the one of the plurality of bit lines to the first voltage; and driving the one of the plurality of second word lines to the second voltage to create a high voltage differential between the gate electrode and the two source/drain regions of the programming MOSFET.

11. An integrated circuit memory cell array comprising:

a plurality of first parallel bit lines;

a plurality of second parallel word lines perpendicular to the first parallel word lines;

a plurality of third parallel word lines perpendicular to the first parallel bit lines;

a plurality of memory cells, each memory cell located at an intersection of a first parallel bit line and a pair of second parallel word lines and a third parallel word line, each memory cell having:

a first pass MOSFET (metal-oxide-semiconductor field-effect transistor) having a first gate electrode connected to a word line of the pair of second parallel word lines, and first and second source/drain regions in a substrate for the integrated circuit, the first source/drain region connected to the first parallel bit line, and the first gate electrode controlling electrical connection between the first and second source/drain regions;

a second pass MOSFET having a second gate electrode connected to the same word line, and third and fourth source/drain regions in the substrate for the integrated circuit, the fourth source/drain region connected to the first parallel bit line, and the second gate electrode controlling electrical connection between the third and fourth source/drain regions; and a programming MOSFET having a gate electrode between the second and third source/drain regions, the gate electrode part of the third parallel word lines.

12. The memory cell array of claim 11, wherein the plurality of second parallel word lines comprise accessing word lines, and the plurality of third parallel word lines comprise programming word lines in the array.

* * * * *

UNITED STATES PATENT AND TRADEMARK OFFICE
CERTIFICATE OF CORRECTION

PATENT NO. : 10,032,522 B2
APPLICATION NO. : 15/620657
DATED : July 24, 2018
INVENTOR(S) : Harry Shengwen Luan et al.

It is certified that error appears in the above-identified patent and that said Letters Patent is hereby corrected as shown below:

In the Claims

Column 6, Line 49, Claim 5, delete "comprise material" and insert --comprise a material--.

Column 8, Line 14, Claim 11, delete "first parallel word lines;" and insert --first parallel bit lines;--.

Signed and Sealed this
Fourth Day of December, 2018

Andrei Iancu
*Director of the United States Patent and Trademark Office*